United States Patent
Kim

(10) Patent No.: US 8,304,281 B2
(45) Date of Patent: Nov. 6, 2012

(54) DRIVING TRANSISTOR OF ORGANIC LIGHT-EMITTING, METHOD FOR FABRICATING THE TRANSISTOR, AND ORGANIC LIGHT-EMITTING DEVICE INCLUDING THE TRANSISTOR

(75) Inventor: Cheol Se Kim, Daegu-si (KR)

(73) Assignee: LG Display Co., Ltd., Seoul (KR)

( * ) Notice: Subject to any disclaimer, the term of this patent is extended or adjusted under 35 U.S.C. 154(b) by 3 days.

(21) Appl. No.: 12/892,606

(22) Filed: Sep. 28, 2010

(65) Prior Publication Data

US 2011/0210331 A1  Sep. 1, 2011

Related U.S. Application Data

(62) Division of application No. 11/645,745, filed on Dec. 27, 2006, now Pat. No. 7,825,415.

(30) Foreign Application Priority Data

Jun. 30, 2006 (KR) .......................... 10-2006-061380
Jun. 30, 2006 (KR) .......................... 10-2006-061382
Nov. 13, 2006 (KR) .......................... 10-2006-111767

(51) Int. Cl.
*H01L 21/00* (2006.01)
(52) U.S. Cl. ............................. 438/82; 438/85; 438/104
(58) Field of Classification Search .......... 438/149–155, 438/479–480, 517, E21.533, 82–85
See application file for complete search history.

(56) References Cited

U.S. PATENT DOCUMENTS 7,365,810 B2   4/2008   Gotoh et al. .................... 349/43
7,378,303 B2 *  5/2008  Shih et al. ...................... 438/149

* cited by examiner

*Primary Examiner* — Cuong Q Nguyen
(74) *Attorney, Agent, or Firm* — Morgan, Lewis & Bockius LLP

(57) ABSTRACT

A driving TFT for an organic light-emitting display device includes a gate electrode on a portion of a substrate, a gate insulation layer on an entire surface of the substrate including the gate electrode, a semiconductor layer on the gate insulation layer and covering the gate electrode, the semiconductor layer including an n-type impurity layer, and source and drain electrodes overlapping portions of the semiconductor layer at respective sides thereof.

5 Claims, 9 Drawing Sheets

DRIVING TRANSISTOR OF ORGANIC LIGHT-EMITTING, METHOD FOR FABRICATING THE TRANSISTOR, AND ORGANIC LIGHT-EMITTING DEVICE INCLUDING THE TRANSISTOR

This application is a divisional application of application Ser. No. 11/645,745, filed on Dec. 27, 2006 now U.S. Pat. No. 7,825,415, which claims the benefit of Korean patent Application Nos. 10-2006-061380 and 10-2006-061382, filed on Jun. 30, 2006, and 10-2006-111767, filed on Nov. 13, 2006, all four of which are hereby incorporated by reference in their entirety.

BACKGROUND OF THE INVENTION

1. Field of the Invention

Embodiments of the present invention relate to an organic light-emitting display device, and more particularly, to a thin film transistor of an organic light-emitting device. Embodiments of the present invention are suitable for a wide scope of applications. In particular, embodiments of the present invention are suitable for driving a thin film transistor of an organic light-emitting display device for a long time period, and a method for fabricating the driving thin film transistor.

2. Discussion of the Related Art

Recently, various flat displays have been developed, which can overcome the shortcomings of cathode ray tubes (CRT), which are heavy and bulky. Examples of these flat display devices are a liquid crystal display (LCD), a field emission display (FED), a plasma display panel (PDP), and a light-emitting display (LED).

In particular, the LED is a self light-emitting device in which a fluorescent substance emits light by coupling electrons and holes. The LED may be divided into an inorganic light-emitting display device which uses a fluorescent substance of an inorganic compound; and an organic light-emitting display device which uses a fluorescent substance of an organic compound. The LED is of particular interest because it requires a low-driving voltage, is self light-emitting and thin, and provides a wide viewing angle, a fast response and a high contrast.

The organic LED device includes an electron injection layer, an electron transport layer, a light-emission layer, a hole transport layer, and a hole injection layer formed between a cathode and an anode. If a predetermined voltage is applied between the cathode and the anode, an electron generated in the cathode moves to the light-emission layer through the electron injection layer and the electron transport layer. Also, a hole generated in the anode moves to the light-emission layer through the hole injection layer and the hole transport layer. In the light-emission layer, the electron supplied by the electron transport layer is re-coupled with the hole supplied by the hole transport layer, thereby emitting the light.

FIG. 1A shows a circuit diagram illustrating one pixel of the related art organic light-emitting display device. Referring to FIG. 1A, the pixel in the related art organic light-emitting display device includes a gate line (not shown, Vdd-applying side) and a data line (not shown, Idata-applying side) crossing each other; first and second switching transistors T1 and T2; a third switching transistor T3; and a fourth switching transistor T4. The first and second transistors T1 and T2 include gate terminals connected to the gate line, and drain terminals connected to the data line. Also, the third switching transistor T3 is connected between a source terminal of the first switching transistor T1 and a source terminal of the second switching transistor T2. The fourth switching transistor T4 is connected between a power-supplying terminal (VDD) and the source terminal of the first switching transistor T1. Further, an organic light-emitting diode (OLED) is formed between a ground terminal and source terminals of the third and fourth switching transistors T3 and T4. Then, a storage capacitor Cs is foamed between a gate terminal of the third switching transistor T3 and the ground terminal. In this case, the third switching transistor T3 functions as a driving transistor to drive the OLED.

Operation of the related art organic light-emitting display device will be described as follows. If an address voltage VADD is turned-on (on), the first and second switching transistors T1 and T2 are turned-on. Then, a data current Idata is charged on the storage capacitor Cs through the first switching transistor T1. Thus, the third switching transistor T3 is turned-on. Hence, a current flows in the OLED through the second and third switching transistors T2 and T3, and the fourth switching transistor T4 is also concurrently turned-on. Thus, electric charges supplied from the address voltage VADD flow into the fourth switching transistor T4. If the address voltage VADD is turned-off, the second switching transistor T2 is turned-off. However, the third and fourth switching transistors T3 and T4 are maintained in the turning-on state by the voltage stored in the storage capacitor (Cs), whereby the current flows in.

Thus, it is necessary that the third and fourth switching transistors T3 and T4 have the same threshold voltage Vth. That is, the threshold voltage of the fourth switching transistor T4 should be compensated by the third switching transistor T3. However, since the voltage applied to the drain terminal of the third switching transistor T3 is different from that of the fourth switching transistor T4, the threshold voltage of the third switching transistor T3 is different from the threshold voltage of the fourth switching transistor T4, thereby causing an incorrect compensation. During current compensation, it takes a long time to charge the storage capacitor (Cs) in the low current level.

FIG. 1B shows a graphical illustration of a variation of a drain current in accordance with a data voltage in the driving thin film transistor of FIG. 1A. Referring to FIG. 1B, the driving thin film transistor T3 has a threshold voltage Vth1 greater than or equal 0. A gate bias voltage of the driving TFT T3 changes in accordance with a data voltage Vdata within a range from Vd_min to Vd_max. A positive stress (+ stress) is applied to the driving thin film transistor. Thus, the threshold voltage changes with time. Hence, the life span of the driving thin film transistor T3 becomes shorter.

For example, if the driving thin film transistor T3 is driven in the predetermined range Vd_min to Vdmax of the data voltage range Vdata range, an initial data voltage value Vd_min of a minimum value corresponds to an initial threshold voltage Vth1 of the driving thin film transistor. For example, Vth1 can be 0V or slightly larger value than 0V. However, if the positive bias stress is continuously applied to the driving thin film transistor T3, the threshold voltage increases. As a result, the driving thin film transistor is not turned-on due to the increase of threshold voltage after a predetermined time period.

In the related art organic light-emitting display device, four switching transistors are provided for one pixel. Thus, the portion provided with the switching elements and the storage capacitor serves as light-shielding portions, whereby the resolution and aperture ratio deteriorates, thereby lowering the picture quality.

FIG. 2 shows a cross-sectional view of the driving thin film transistor of FIG. 1A. Referring to FIG. 2, the driving thin film transistor T3 of FIG. 1A includes a gate electrode 11 formed on a predetermined portion of a substrate 10; a gate insulation layer 13 formed on an entire surface of the substrate 10 including the gate electrode 11; a semiconductor layer 15 formed on the gate insulation layer 13 and formed in an island shape of covering the gate electrode 11; and source and drain electrodes 17 and 18 formed at both sides of the semiconductor layer 15.

Also, a passivation layer 16 is formed on the entire surface of the substrate 10 including the source and drain electrodes 17 and 18. The passivation layer 16 has a contact hole to expose the upper side of the drain electrode 18. A first transparent electrode 19 is electrically connected to the drain electrode 18 by filling-up the contact hole with a transparent material. Then, an organic light-emission layer is interposed between the first transparent electrode 19 and a second electrode (not shown), whereby images are displayed based on the operation of the driving thin film transistor. The first electrode 19, the second electrode, and the organic light-emission layer function as the OLED.

The semiconductor layer 15 includes an amorphous silicon layer 13, and an impurity layer 14 formed under the source and drain electrodes 17 and 18. If the driving thin film transistor is provided with the semiconductor layer 15 including the amorphous silicon layer 13, a channel region is defined in the amorphous silicon layer 13. Such a structure is referred to as a back channel etched (BCE) type amorphous silicon thin film transistor. In this case, if the driving thin film transistor is an n-type, the driving thin film transistor is turned-on by applying a positive voltage to the gate.

Accordingly, the related art organic light-emitting display device has the following disadvantages. In the amorphous silicon thin film transistor, the threshold voltage is moved in the positive direction according to the positive stress of gate voltage, and the threshold voltage is moved in the negative direction according to the negative stress of gate voltage. The movement of the threshold voltage is not problematic if the duty ratio is small as shown in the LCD device. However, if the duty ratio is large as shown in the driving thin film transistor for the active-matrix type organic light-emitting display device, the movement of threshold voltage may affect the life span of the display.

In the related art organic light-emitting display device, four switching transistors are provided for one pixel. Thus, the portion provided with the switching elements and the storage capacitor serves as light-shielding portions, whereby the resolution and aperture ratio deteriorates, thereby lowering the picture quality.

SUMMARY OF THE INVENTION

Accordingly, the present invention is directed to a driving thin film transistor of an organic light-emitting display device and a method for fabricating the same, which substantially obviate one or more problems due to limitations and disadvantages of the related art.

An object of the present invention is to provide an organic light-emitting display device that can be driven over an extended period of time.

Another object of the present invention is to provide a thin film transistor for driving an organic light-emitting display device over an extended period of time.

Another object of the present invention is to provide a method of fabricating a thin film transistor for driving an organic light-emitting display device over an extended period of time.

Additional features and advantages of the invention will be set forth in the description of exemplary embodiments which follows, and in part will be apparent from the description of the exemplary embodiments, or may be learned by practice of the exemplary embodiments of the invention. These and other advantages of the invention will be realized and attained by the structure particularly pointed out in the written description of the exemplary embodiments and claims hereof as well as the appended drawings.

To achieve these and other advantages and in accordance with the purpose of the present invention, as embodied and broadly described, a driving TFT for an organic light-emitting display device includes a gate electrode on a substrate, a gate insulation layer on the substrate including the gate electrode, a semiconductor layer on the gate insulation layer and covering the gate electrode, the semiconductor layer including an n-type impurity layer, and source and drain electrodes overlapping portions of the semiconductor layer at respective sides thereof.

In another aspect, a driving TFT for an organic light-emitting display device includes a gate electrode on a substrate, a gate insulation layer on the substrate including the gate electrode, a semiconductor layer on the gate insulation layer and covering the gate electrode, the semiconductor layer including a deposition layer of an n-type impurity layer, an amorphous silicon layer and an n+-type impurity layer, and source and drain electrodes overlapping portions of the semiconductor layer at respective sides thereof.

In another aspect, a driving TFT for an organic light-emitting display device includes a gate electrode on a substrate, a gate insulation layer on the substrate including the gate electrode, a semiconductor layer on the gate insulation layer and covering the gate electrode, the semiconductor layer including a deposition layer of a first amorphous silicon layer, an n-type impurity layer, a second amorphous silicon layer, and an n+-type impurity layer, and source and drain electrodes overlapping portions of the semiconductor layer at respective sides thereof.

In another aspect, a method for fabricating a driving TFT for an organic light-emitting display device includes forming a gate electrode on a substrate, forming a gate insulation layer on the substrate including the gate electrode, forming a semiconductor layer on the gate insulation layer, the semiconductor layer covering the gate electrode and including an n-type impurity layer, and forming source and drain electrodes overlapping portions of the semiconductor layer at respective sides thereof.

In another aspect, a method for fabricating a driving TFT for an organic light-emitting display device includes forming a gate electrode on a substrate, forming a gate insulation layer on the substrate including the gate electrode, forming a semiconductor layer pattern by sequentially depositing and selectively patterning a first impurity (n-type impurity) layer, an amorphous silicon layer and a second impurity (n+-type impurity) layer on the gate insulation layer above the gate electrode, forming source and drain electrodes overlapping portions of the semiconductor layer pattern at respective sides thereof by depositing a metal layer on the entire surface of the substrate including the semiconductor layer pattern, and selectively patterning the deposited metal layer, and forming a semiconductor layer including the second impurity layer, the amorphous silicon layer and the first impurity layer by removing an exposed portion of the second impurity layer between the source and drain electrodes.

In another aspect, a method for fabricating a driving TFT for an organic light-emitting display device includes forming a gate electrode on substrate, depositing a gate insulation layer on the substrate including the gate electrode, forming a semiconductor layer pattern by sequentially depositing and selectively patterning an amorphous silicon layer and an impurity layer on the gate insulation layer above the gate electrode, and forming source and drain electrodes overlapping portions of the semiconductor layer pattern at respective sides thereof by depositing a metal layer on the entire surface of the substrate including the semiconductor layer pattern, and selectively patterning the deposited metal layer.

In another aspect, a method for fabricating a driving TFT for an organic light-emitting display device includes forming a gate electrode on a substrate, depositing a gate insulation layer on the substrate including the gate electrode, forming a semiconductor layer pattern by sequentially depositing and selectively patterning a first amorphous silicon layer, a first impurity (n-type impurity) layer, a second amorphous silicon layer and a second impurity (n+-type impurity) layer on the gate insulation layer above the gate electrode, and forming source and drain electrodes overlapping portions of the semiconductor layer pattern at respective sides thereof by depositing a metal layer on the entire surface of the substrate including the semiconductor layer pattern, and selectively patterning the deposited metal layer, and forming a semiconductor layer including the first amorphous silicon layer, the second impurity layer, the second amorphous silicon layer and the first impurity layer by removing an exposed portion of the second impurity layer between the source and drain electrodes.

In another aspect, an organic light-emitting display device includes one or more gate line and one or more data line crossing each other to define one or more pixel region, the one or more gate line in a first direction, and the one or more data line in a second direction, a switching transistor at a crossing of the one or more gate line and the one or more data line, a storage capacitor between the switching transistor and a ground, a driving transistor between the storage capacitor and the switching TFT, wherein the driving transistor has a negative threshold voltage, and an organic light-emitting diode between a power source and the driving transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiments of the present invention and together with the description serve to explain the principle of embodiments of the present invention. In the drawings.

DETAILED DESCRIPTION OF EXEMPLARY EMBODIMENTS

Reference will now be made in detail to exemplary embodiments of the present invention, which are illustrated in the accompanying drawings. Wherever possible, the same reference numbers will be used throughout the drawings to refer to the same or like parts.

Figure 1A:
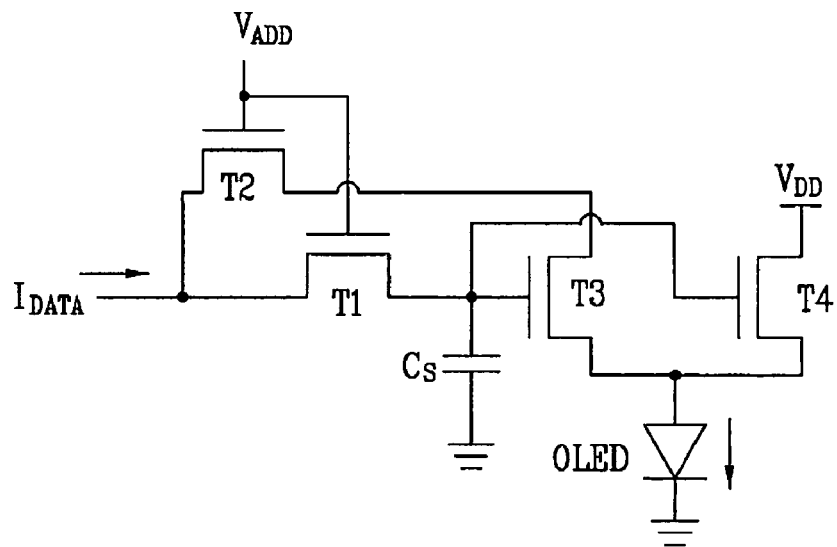
FIG. 1A shows a circuit diagram illustrating one pixel of the related art organic light-emitting display device.
Figure 1B:
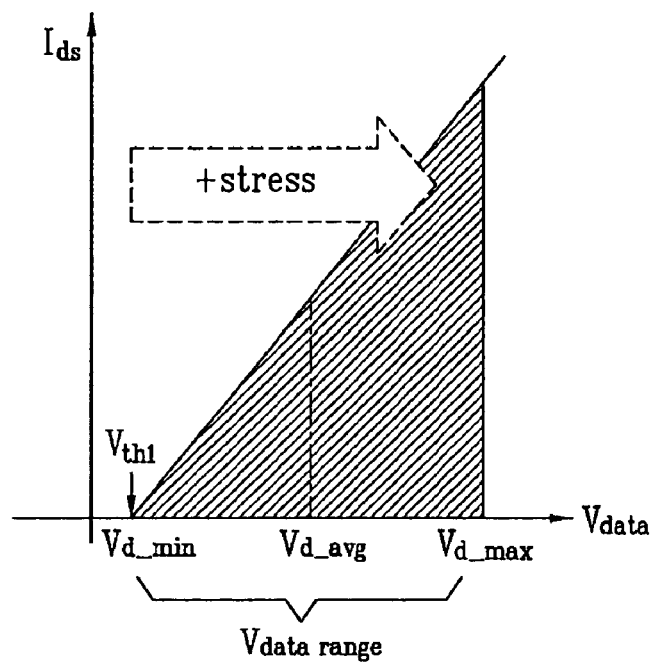
FIG. 1B shows a graphical illustration of a variation of a drain current in accordance with a data voltage in the driving thin film transistor of FIG. 1A.
Figure 2:
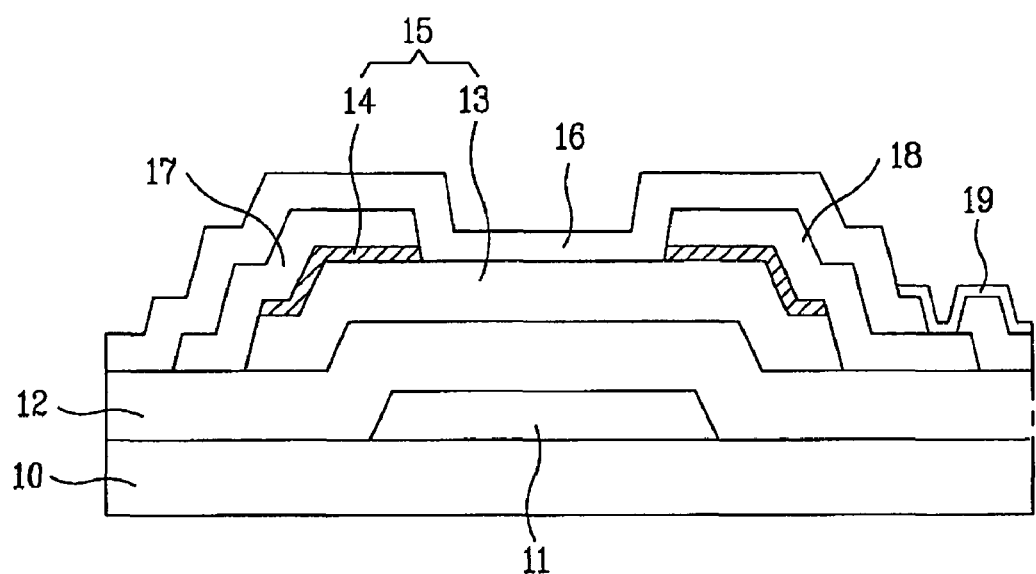
FIG. 2 shows a cross-sectional view of the driving thin film transistor of FIG. 1A.
Figure 3:
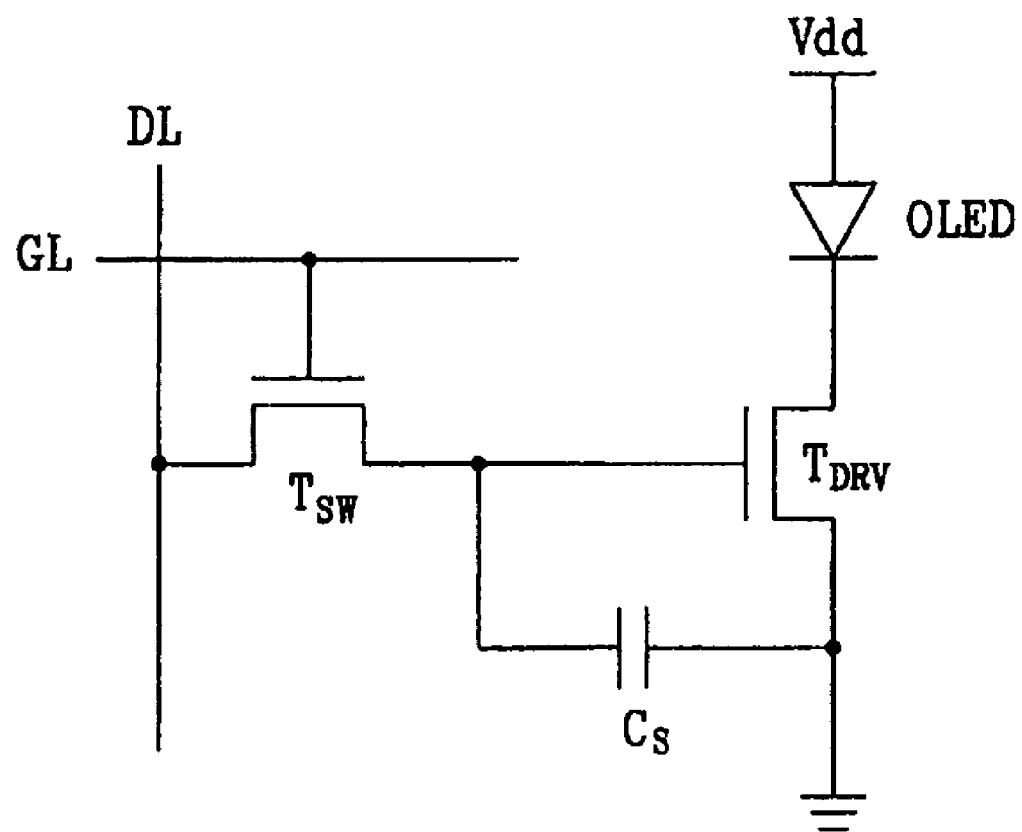
FIG. 3 shows a circuit diagram of an exemplary pixel of an organic light-emitting display device according to an embodiment of the present invention.

FIG. 3 shows a circuit diagram of an exemplary pixel of an organic light-emitting display device according to an embodiment of the present invention. Referring to FIG. 3, the organic light-emitting display device of the present invention includes gate and data lines GL and DL crossing each other; a switching thin film transistor (TFT) Tsw provided between the gate and data lines GL and DL; a driving TFT Tdrv; a storage capacitor Cs; and an organic light-emitting diode (OLED).

The switching TFT Tsw may include a gate electrode connected to the gate line GL; a source electrode connected to the data line DL; and a drain electrode connected to a gate electrode of the driving TFT Tdrv. The driving TFT Tdrv includes a drain electrode which is connected to a cathode electrode of the organic light-emitting diode OLED; and a source electrode which is grounded. An anode electrode of the OLED is connected to a power supplying line Vdd. Also, the storage capacitor Cs is connected to the gate and source electrodes of the driving TFT Tdrv.

The switching TFT Tsw is turned-on by a signal applied to the switching TFT Tsw through the gate line GL. Then, a signal of the data line (DL) is transmitted to the gate electrode of the driving TFT Tdrv, whereby the driving TFT Tdrv is turned-on, and the OLED emits the light. When the switching TFT Tsw is turned-off, the storage capacitor (Cs) maintains a uniform gate voltage of the driving TFT Tdrv.

In an embodiment, an active matrix organic light-emitting display device using OLED in a circuit arrangement that includes switching TFT Tsw and the driving TFT Tdrv, each of which including polysilicon TFTs, to thereby improve the mobility. However, since the polysilicon TFT requires complicated processes, such as a complex crystallization process, it is difficult to form large sized polysilicon TFTs. In addition, the polysilicon TFT may cause low stability of device and poor uniformity of picture quality.

Accordingly, in another embodiment of the present invention, the switching TFT and the driving TFT include amorphous silicon TFTs to avoid the shortcomings of the polysilicon TFT.

Figure 4:
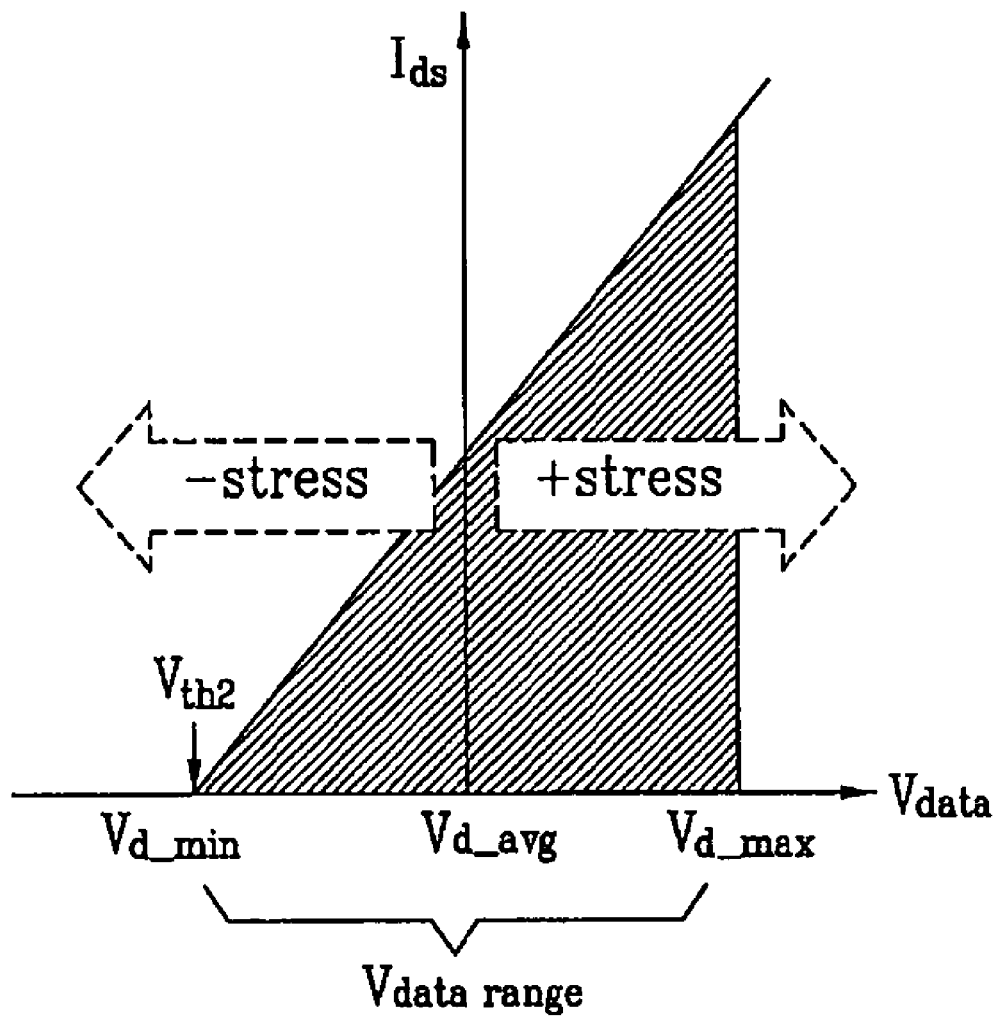
FIG. 4 shows a graphical illustration of a variation of a drain current in accordance with a data voltage in the driving thin film transistor of FIG. 3.

FIG. 4 shows a graphical illustration of a variation of a drain current in accordance with a data voltage in the driving thin film transistor of FIG. 3. Referring to FIG. 4, the driving TFT Tdrv is driven in a predetermined data voltage range Vdata_range including a negative threshold voltage Vth2. The data voltage range Vdata range is between a minimum data voltage Vd_min and a maximum data voltage Vd_max. The corresponding threshold voltage Vth2 corresponds to a predetermined value obtained by subtracting an intermediate data voltage Vd_avg from the minimum data voltage Vd_min.

In accordance with FIG. 4, the zero value of data voltage Vdata corresponds to an intermediate gray scale Vd_avg. Accordingly, a positive bias stress (+ stress) is applied to the driving TFT Tdrv when the data voltage Vdata is above the intermediate gray scale Vd_avg, and a negative bias stress (− stress) is applied to the driving TFT Tdrv when the data voltage Vdata is below the intermediate gray scale Vd_avg. Accordingly, the change in threshold voltage can be minimized.

For example, when the threshold voltage Vth2 of the driving TFT Tdrv is negative, the positive bias stress (+ stress) is the same in absolute value as the negative bias stress (− stress) when driving the driving TFT Tdrv. Thus, it is possible to minimize the stress applied to the driving TFT Tdrv, thereby minimizing the variation in the threshold voltage of the driving TFT Tdrv after a predetermined time period. When the threshold voltage Vth2 of the driving TFT Tdrv is negative, the time averaged gate bias stress of the driving TFT Tdrv is almost zero. Thus, the life span of the driving thin film transistor and display device improves.

In accordance with an embodiment of the present invention, the organic light-emitting display device is provided with the driving TFT having a negative threshold voltage obtained by averaging the maximum and the minimum values of the driving data voltage. Thus, it is possible to prevent the threshold voltage from increasing with time.

In accordance with an embodiment of the present invention, a driving thin film transistor having the negative threshold voltage is used to lower the applied data voltage required for turning on the driving TFT. Thus, the entire driving voltage is lowered so that the power consumption is decreased.

In accordance with an embodiment of the present invention, the voltage applied to the gate electrode of the driving TFT is lowered due to the low driving voltage required for turning-on the driving TFT. Thus, the reliability of device is improved.

Moreover, in accordance with an embodiment of the present invention, a channel region of the driving TFT is formed of an n-type amorphous silicon layer. Thus, the reliability of device is further improved.

Figure 5:
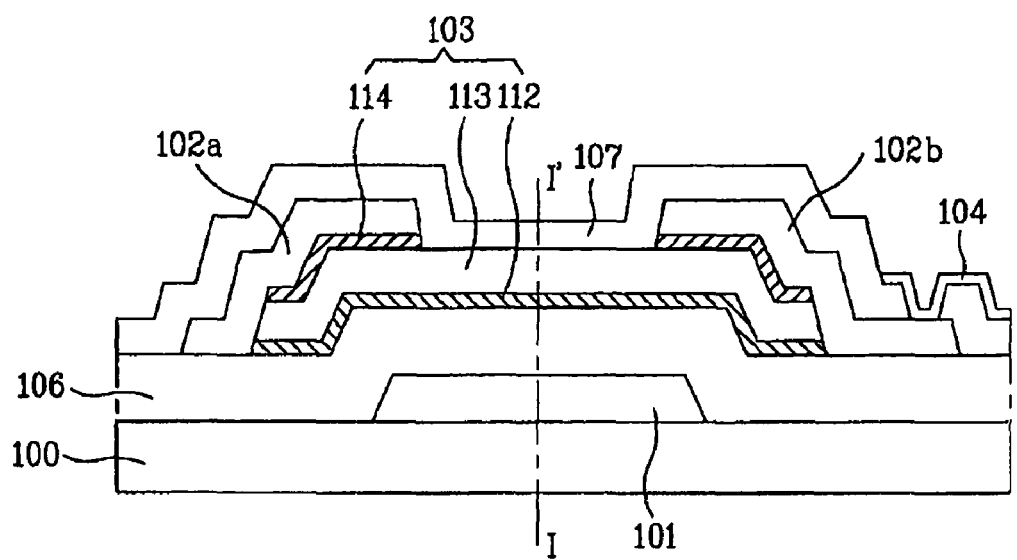
FIG. 5 shows a cross-sectional view of a first exemplary driving thin film transistor for an organic light-emitting display device according to an embodiment of the present invention.

FIG. 5 shows a cross-sectional view of a first exemplary driving thin film transistor for an organic light-emitting display device according to an embodiment of the present invention. Referring to FIG. 5, the driving TFT for the OLED device includes a gate electrode 101 formed on a predetermined portion of a substrate 100; a gate insulation layer 106 formed on the entire surface of the substrate 100 including the gate electrode 101; a semiconductor layer 103 formed on the gate insulation layer 106 and shaped to cover the gate electrode 101; and source and drain electrodes 102a and 102b overlapping portions of the semiconductor layer 103 at respective sides thereof.

The semiconductor layer 103 may include a first n-type impurity silicon layer 112, an intrinsic amorphous silicon layer 113, and a second n+-type impurity silicon layer 114. The second n+-type impurity silicon layer 114 may be formed under the source and drain electrodes 102a and 102b.

Then, a passivation layer 107 is formed on the entire surface of the substrate 100 including the source and drain electrodes 102a and 102b. The passivation layer 107 has a contact hole exposing an upper side of the drain electrode 102b. Also, a first electrode 104 is formed by filling up the contact hole. The first electrode 104 is electrically connected to the drain electrode 102b through the contact hole.

Also, an organic light-emitting layer is interposed between the first electrode 104 and a second electrode (not shown). The organic light-emitting layer emits light based on the operation of the driving thin film transistor to display a corresponding image. In an embodiment, the first electrode 104, the second electrode, and the organic light-emitting layer perform the function the OLED shown in FIG. 3.

The first impurity silicon layer 112 is formed of an n-type impurity silicon with a thickness of about 100 Å to about 1000 Å. The intrinsic amorphous silicon layer 113 is formed with a thickness of about 1000 Å to about 3000 Å. The second impurity silicon layer 114 is formed of an n+-type impurity silicon and is formed with a thickness of about 100 Å to about 1000 Å. The first impurity silicon layer 112 corresponds to an n-type impurity silicon, which has a doping density of 100 ppm to 10000 ppm. Also, the second impurity silicon layer 114 corresponds to an n+-type impurity silicon, which has a doping density of 10000 ppm. When forming the semiconductor layer 103 by sequentially depositing the first impurity silicon layer 112, the amorphous silicon layer 113 and the second impurity silicon layer 114, the doping density is controlled with a content ratio of SiH4 and PH3 in a deposition gas. That is, the amorphous silicon layer 113 is formed of the intrinsic SiH4 content. Also, the PH3 content of the second impurity silicon layer 114 is relatively lower than the PH3 content of the first impurity silicon layer 112. Accordingly, the driving TFT of the organic light-emitting display device has a negative threshold voltage.

Figure 6A:
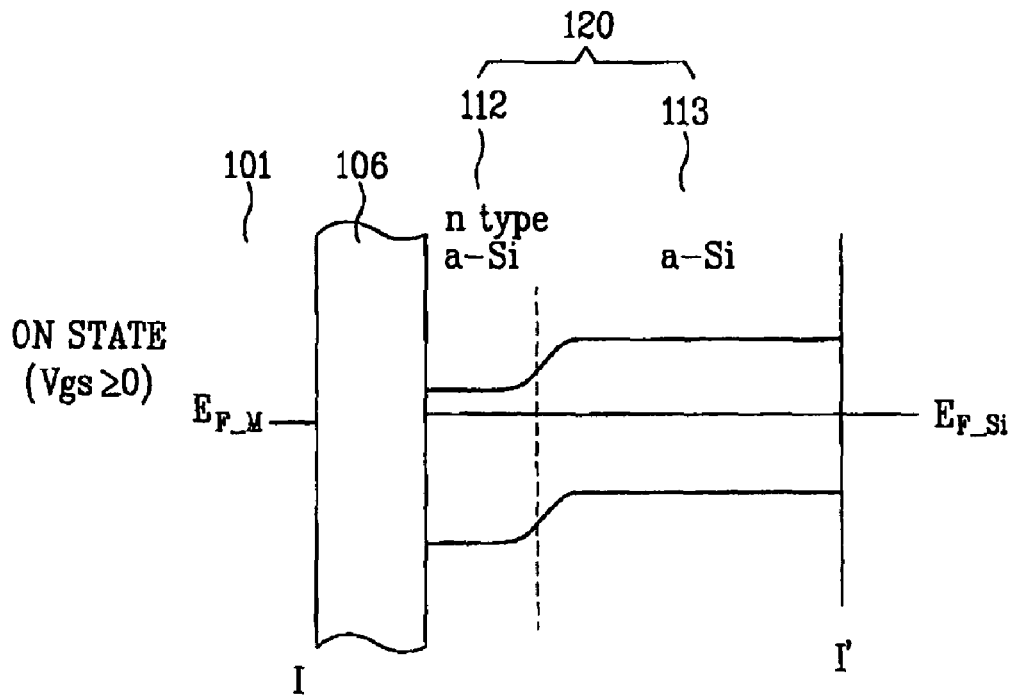
FIG. 6A shows an exemplary energy band for a cross section I-I' of the driving TFT of FIG. 5 when a positive voltage is applied to a gate thereof.

FIG. 6A shows an exemplary energy band for a cross section I-I' of the driving TFT of FIG. 5 when a positive voltage is applied to a gate thereof. Referring to FIG. 6A, if a gate voltage Vgs of zero or a slightly larger than zero is applied to a gate electrode of the driving TFT, the driving TFT is turned-on because of the negative threshold voltage of the driving TFT. FIG. 6A shows an exemplary shape of the energy band for each of the gate electrode 101, the gate insulation layer 106, the first impurity silicon layer 112, and the amorphous silicon layer 113, sequentially provided along I-I' of FIG. 5. When the driving TFT is on, the gate electrode 101 is substantially identical or similar in Fermi level (EF_M, EF_SI) to the semiconductor layer 103. Also, the energy level rises on the interface between the first impurity silicon layer 112 and the amorphous silicon layer 113. That is, it is possible to maintain the energy level above a predetermined value in the amorphous silicon layer 113. Accordingly, the current flows in the drain electrode 102 and the first electrode 104 through the semiconductor layer 103. In this case, even if the gate voltage is not applied, or a small gate voltage is applied to the turned-on driving TFT, the current flows due to the electric charges of high density accumulated on the channel region of the driving TFT.

Figure 6B:
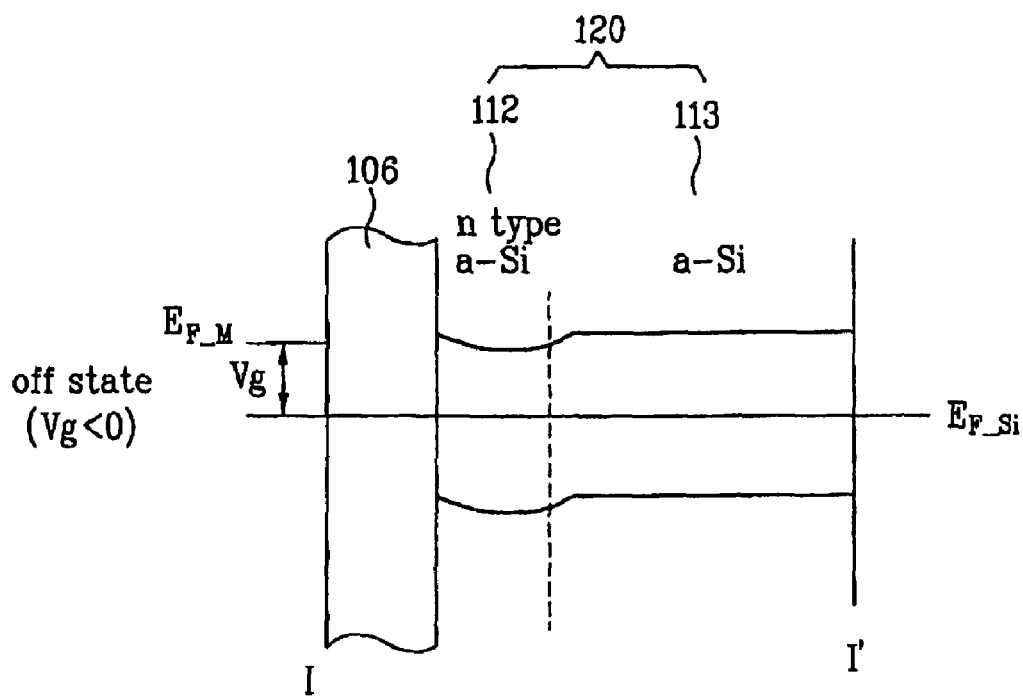
FIG. 6B shows an exemplary energy band for a cross section of the driving TFT of FIG. 5 when a negative voltage is applied to a gate thereof.

FIG. 6B shows an exemplary energy band for a cross section I-I' of the driving TFT of FIG. 5 when a negative voltage is applied to a gate thereof. Referring to FIG. 6B, if a gate voltage Vgs having a negative value below the threshold voltage is applied to the gate electrode, the Fermi level (EF_M) of the gate electrode 101 is relatively higher than the Fermi level (EF_SI) of the semiconductor layer 103. Thus, the resistance is increased in the channel of the semiconductor layer 103, so that the current is cut off and the driving thin film transistor is turned off.

Figure 7:
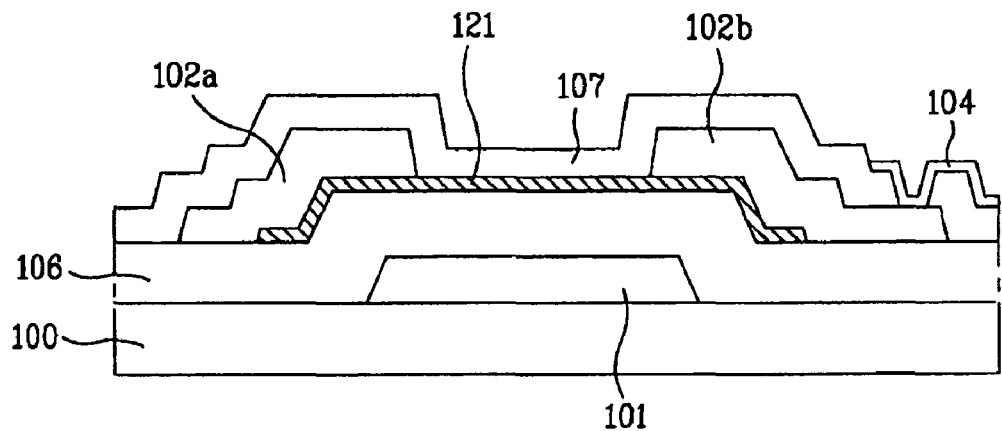
FIG. 7 shows a cross-sectional view of a second exemplary driving thin film transistor for an organic light-emitting display device according to another embodiment of the present invention.

FIG. 7 shows a cross-sectional view of a second exemplary driving thin film transistor for an organic light-emitting display device according to another embodiment of the present invention. Referring to FIG. 7, the driving TFT of the organic light-emitting display device includes a gate electrode 101 formed on a predetermined portion of a substrate 100; a gate insulation layer 106 formed on an entire surface of the substrate 100 including the gate electrode 101; a semiconductor layer 121 formed on the gate insulation layer 106 and shaped to cover the gate electrode 101; and source and drain electrodes 102a and 102b overlapping portions of the semiconductor layer 121 at respective sides thereof.

The semiconductor layer 121 is formed of an n-type impurity silicon layer. In comparison with the TFT of FIG. 5 including the semiconductor layer formed of a first n-type impurity silicon layer, an intrinsic amorphous silicon layer, and a second n+-type impurity silicon layer, the semiconductor layer 121 of FIG. 7 includes only an n-type impurity silicon layer. The n-type impurity silicon layer 121 may be formed with a thickness of about 100 Å to about 500 Å.

Figure 8:
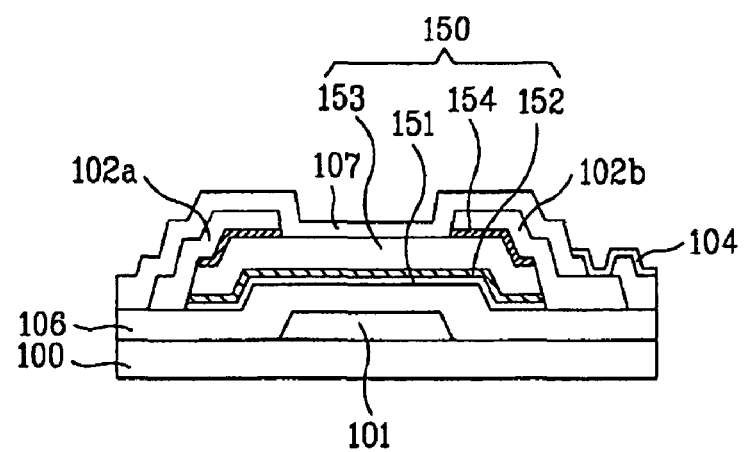
FIG. 8 shows a cross-sectional view of a third exemplary driving thin film transistor for an organic light-emitting display device according to yet another embodiment of the present invention.

FIG. 8 shows a cross-sectional view of a third exemplary driving thin film transistor for an organic light-emitting display device according to yet another embodiment of the present invention. Referring to FIG. 8, the driving TFT of the organic light-emitting display device includes a gate electrode 101 formed on a predetermined portion of a substrate 100; a gate insulation layer 106 formed on an entire surface of the substrate 100 including the gate electrode 101; a semiconductor layer 150 formed on the gate insulation layer 106 and shaped to cover the gate electrode 101; and source and drain electrodes 102 and 102b overlapping portions of the semiconductor layer 103 at respective sides thereof.

The semiconductor layer 150 is formed of a first intrinsic amorphous silicon layer 151, a first n-type impurity silicon layer 152, a second intrinsic amorphous silicon layer 153, and a second n+-type impurity silicon layer 154. The second n+-type impurity silicon layer 154 may be formed under the source and drain electrodes 102a and 102b.

Then, a passivation layer 107 is formed on the entire surface of the substrate 100 including the source and drain electrodes 102a and 102b. The passivation layer 107 has a contact hole exposing an upper side of the drain electrode 102b. Also, a first electrode 104 is formed by filling up the contact hole. The first electrode 104 is electrically connected to the drain electrode 102b through the contact hole.

In comparison with the structure of the driving TFT of FIG. 5, the driving TFT of FIG. 8 further includes the intrinsic amorphous semiconductor layer (first amorphous silicon layer 151) having a thickness of about 100 Å to about 600 Å, positioned between the gate insulation layer 106 and the first impurity silicon layer 152. This structure shown in FIG. 8 is suitable for lowering the threshold voltage in a negative gate-voltage direction without lowering the field effect mobility. The field effect mobility may be generated by the n-type impurity semiconductor layer used in the channel.

The first impurity layer 152 includes an n-type impurity material, and is formed with a thickness of about 50 Å to about 800 Å. The second amorphous silicon layer 153 is formed with a thickness of about 500 Å to about 1500 Å. The second impurity layer 154 is formed in the n+-type, and is formed at a thickness of about 100 Å to about 1000 Å.

Thus, in accordance with embodiments of the present invention, the driving TFT of the organic light-emitting display devices has a negative threshold voltage.

Figure 9A:
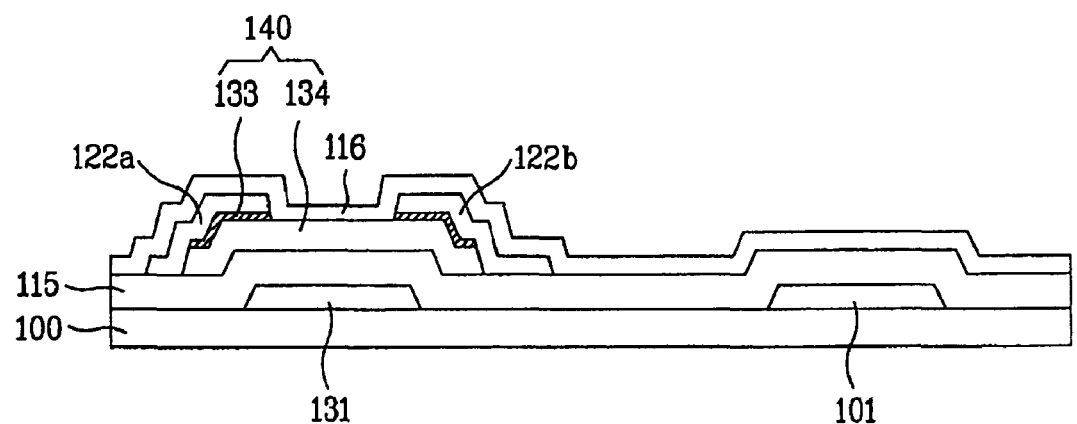
FIGS. 9A and 9C show cross-sectional views illustrating a method for fabricating an organic light-emitting display device including a driving thin film transistor according to an embodiment of the present invention.
Figure 9B:
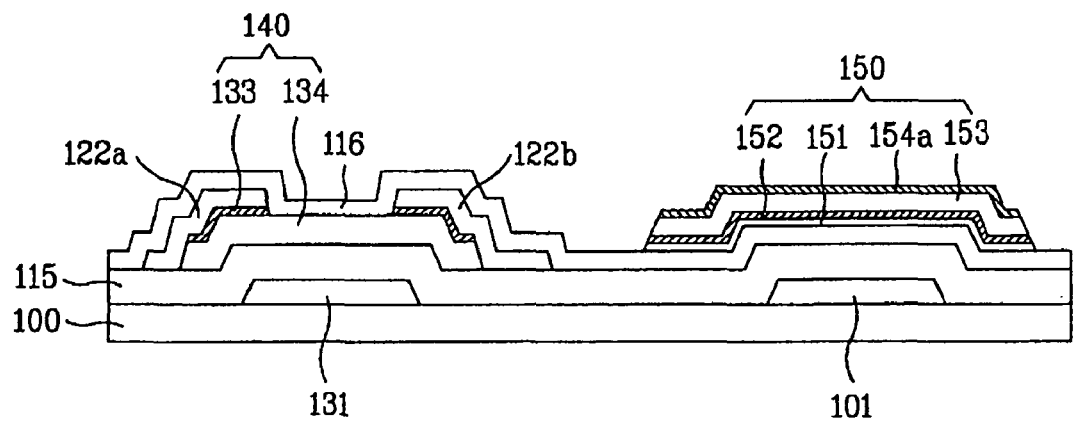
Figure 9C:
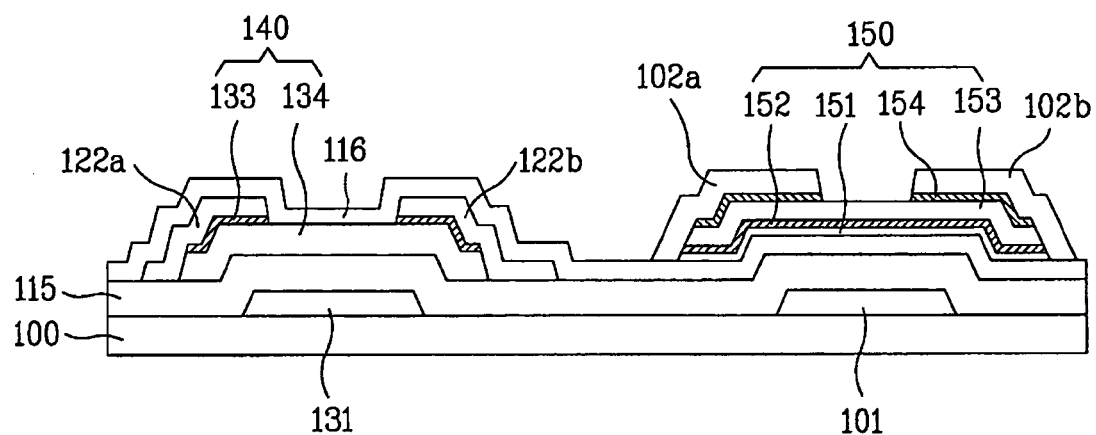

FIGS. 9A and 9C show cross-sectional views illustrating a method for fabricating an organic light-emitting display device including a driving thin film transistor according to an embodiment of the present invention Referring to FIGS. 9A to 9C, the organic light-emitting display device includes a switching TFT and a driving TFT. The driving TFT can be, for example, the one shown in FIG. 8.

First, as shown in FIG. 9A, a metal layer is deposited on the entire surface of a substrate 100. Then, the metal layer is selectively patterned to form a switching gate electrode 131 and a driving gate electrode 101 on portions of the substrate 100. The switching gate electrode 131 is spaced from the driving gate electrode 101.

Then, a gate insulation layer 115 is formed on the entire surface of the substrate 100 including the switching and driving gate electrodes 131 and 101.

Then, an amorphous silicon layer 134 and an impurity layer 133 are sequentially deposited on the gate insulation interlayer 115 including the switching and driving gate electrodes 131 and 101, and are then selectively patterned, thereby forming a semiconductor layer pattern.

Thereafter, a metal layer is deposited on the first insulation interlayer 115 including the semiconductor layer pattern, and is then selectively patterned, thereby forming source and drain electrodes 122a and 122b corresponding to both sides of the semiconductor layer pattern. Then, a semiconductor layer 140 is formed including remaining portions of the amorphous silicon layer 134 and the impurity layer 133 patterned by removing a portion of the impurity layer 133 between the source and drain electrodes 122a and 122b.

Then, a second insulation interlayer 116 is formed on an entire surface of the first insulation interlayer 115 including the source and drain electrodes 122a and 122b.

Referring to FIG. 9B, a first intrinsic amorphous silicon layer 151, an n-type impurity layer 152, a second intrinsic amorphous silicon layer 153, and an n+-type impurity layer 154a are sequentially deposited on the second insulation interlayer 116, and selectively patterned to form a driving semiconductor layer 150 which has an island-shape covering the driving gate electrode 101.

Referring to FIG. 9C, a metal layer is deposited on an entire surface of the second insulation interlayer 116 including the driving semiconductor layer 150, and is selectively patterned to form source and drain electrodes 102a and 102b at both sides of the metal layer. Using the source and drain electrodes 102a and 102b as a mask, a portion the second impurity layer 154a is selectively removed between the source and drain electrodes 102a and 102b.

Through the above-mentioned steps, the driving TFT having driving gate electrode 101 and the switching TFT having switching gate electrode 131 are formed in the organic light-emitting display device. The second insulation interlayer 116 and the first gate insulation layer 115 deposited between the driving gate electrode 101 and a first intrinsic amorphous silicon layer 151 in FIG. 9C may correspond to the gate insulation layer 106 of FIG. 8.

Subsequently, as shown in FIG. 8, a passivation layer 107 is deposited on the entire surface of the second insulation interlayer 116 including the source and drain electrodes 102a and 102b. Then, the passivation layer 107 and the second insulation interlayer 116 are selectively removed to form a contact hole exposing an upper portion of the drain electrode 102b. The contact hole may be formed on the drain electrode 122b of the switching TFT as well as on the drain electrode 102b of the driving TFT.

Thereafter, a transparent electrode is formed on the entire surface of the passivation layer 107 including the contact holes. Also, a first electrode 104 is formed by filling up the drain electrode 102b of the driving TFT.

In the structure shown in FIGS. 9A to 9C, the source electrode 102a of the driving TFT may be formed integrally with the drain electrode 122b of the switching TFT to simplify the process of forming the contact hole. In this case, the semiconductor layer of the driving TFT is substantially identical in structure to the semiconductor layer of the switching TFT.

In the method for fabricating the organic light-emitting display device, an organic light-emitting layer and a second electrode are fabricated by similar processes. Thus, additional description for the process of fabricating the organic light-emitting layer and the second electrode will be omitted.

The above-mentioned process steps are related with the method for fabricating the organic light-emitting display device including the driving TFT of FIG. 8. A substantially process may be used to fabricate the organic light-emitting display device including the driving TFT of FIG. 5, except for the lack of the first amorphous silicon layer that is absent from the driving TFT of FIG. 5. A substantially identical process may also be used to fabricate the organic light-emitting display device including the driving TFT of FIG. 7, except that the driving TFT of FIG. 7 is provided with the semiconductor layer 150 formed by the first impurity layer 152 without the first amorphous silicon layer, the second amorphous silicon layer, and the second impurity layer.

In accordance with an embodiment of the present invention, it is possible to lower the data voltage value applied to turn on the driving TFT having the negative threshold voltage. Thus, the entire driving voltage is lowered so that the power consumption is decreased.

In accordance with an embodiment of the present invention, the gate bias stress of the driving TFT is nearly zero. Thus, the lifespan of the driving transistor and display device improves.

In accordance with an embodiment of the present invention, the voltage applied to the gate electrode is lowered due to the low driving voltage of the driving transistor in the on-state. Thus, the reliability of the display device is improved.

Moreover, in accordance with an embodiment of the present invention, the channel of the driving TFT is formed of an (n+) impurity silicon layer which has the better reliability compared with an intrinsic amorphous silicon layer. Thus, it is possible to further improve the reliability of device.

Moreover, in accordance with an embodiment of the present invention, an active matrix type organic light-emitting display device is formed using the driving TFT with a negative threshold voltage. Accordingly, the life span of the display increases.

Further, the gate bias stress is nearly zero in the driving TFT having the negative threshold voltage. Thus, additional compensation circuit is not required to compensate for a change in the threshold voltage of the driving TFT.

It will be apparent to those skilled in the art that various modifications and variations can be made in embodiments of the present invention. Thus, it is intended that embodiments of the present invention cover the modifications and variations of the embodiments described herein provided they come within the scope of the appended claims and their equivalents.

What is claimed is:

1. A method for fabricating a driving TFT for an organic light-emitting display device, the method comprising:
   forming a gate electrode on a substrate;
   forming a gate insulation layer on the substrate including the gate electrode;
   forming a semiconductor layer on the gate insulation layer, the semiconductor layer covering the gate electrode and including at least an n-type impurity layer covering the gate electrode entirely; and
   forming source and drain electrodes overlapping portions of the semiconductor layer at respective sides thereof.

2. The method of claim 1, wherein the forming of the semiconductor layer includes providing n-type impurity ions to an amorphous silicon at a doping density of 100 ppm to 10000 ppm.

3. The method of claim 1, further comprising forming a first amorphous silicon layer and an n+-type impurity layer on the n-type impurity layer.

4. The method of claim 3, wherein the forming of the source and drain electrodes includes removing a portion of the n+-type impurity layer between the source and drain electrodes to exclude a region therebetween.

5. The method of claim 3, further forming a second amorphous silicon layer under the n-type impurity layer.

* * * * *